US009825643B1

(12) United States Patent
Taylor et al.

(10) Patent No.: US 9,825,643 B1
(45) Date of Patent: Nov. 21, 2017

(54) DIGITAL TO ANALOG CONVERSION DEVICE AND CALIBRATION METHOD

(71) Applicant: Rohde & Schwarz GmbH & Co. KG, München (DE)

(72) Inventors: Rawdon Taylor, Hillsboro, OR (US); Mark Lehne, Roseburg, OR (US)

(73) Assignee: Rohde & Schwarz GmbH & Co. KG, München (DE)

( * ) Notice: Subject to any disclaimer, the term of this patent is extended or adjusted under 35 U.S.C. 154(b) by 0 days.

(21) Appl. No.: 15/339,088

(22) Filed: Oct. 31, 2016

(51) Int. Cl.
*H03M 1/10* (2006.01)
*H03M 1/66* (2006.01)
(52) U.S. Cl.
CPC ....... *H03M 1/1023* (2013.01); *H03M 1/1071* (2013.01); *H03M 1/66* (2013.01)
(58) Field of Classification Search
CPC ..... H03M 1/1023; H03M 1/1071; H03M 1/66
USPC .................. 341/118, 120, 155, 144
See application file for complete search history.

(56) References Cited

U.S. PATENT DOCUMENTS

| 5,955,980 A * | 9/1999 | Hanna ................ H03M 1/1057 341/120 |
| 8,368,571 B2 * | 2/2013 | Siragusa ............. H03M 1/1009 341/118 |
| 2011/0037631 A1 * | 2/2011 | Lai ..................... H03M 1/1004 341/120 |
| 2015/0102949 A1 * | 4/2015 | Rajasekhar ........... H03M 1/08 341/118 |

* cited by examiner

*Primary Examiner* — Peguy Jean Pierre
(74) *Attorney, Agent, or Firm* — Jenkins, Wilson, Taylor & Hunt, P.A.

(57) ABSTRACT

A digital to analog conversion, DAC, device for converting digital signals to analog signals comprises a RF output for outputting the analog signals, a thermometer segment comprising a first number of data slices and a second number calibration slices, and a calibration controller, which electrically disconnects one of the data slices from the RF output and at the same time connects one of the calibration slices to the RF output as replacement slice for the respective data slice and performs a calibration of the disconnected data slice.

23 Claims, 5 Drawing Sheets

DIGITAL TO ANALOG CONVERSION DEVICE AND CALIBRATION METHOD

TECHNICAL FIELD

The present invention relates to a digital to analog conversion device. The present invention further relates to a calibration method for such a digital to analog conversion device.

BACKGROUND

Multi-Giga Hertz (multi-GHz) sampling rate Digital to Analog Converters (DACs) are used to interface digital circuitry such as ASICs and FPGAs to analog circuits, for the purpose of digitally synthesizing arbitrary waveforms in applications.

Such applications can include wireless and wireline networks, digital terrestrial television, cellular communication, software defined radio, RADAR, and test and measurement applications.

In these applications, the use of high speed DACs with high dynamic range (accuracy) allows for direct digital synthesis of RF signals with none of the typical intermediate analog circuit functions, such as mixers and oscillators, resulting in systems with less distortion, fewer mixing products, and fewer spurious signals, leading to higher performance products.

Within a high-speed DAC, there are typically at least two types of circuitry: a digital portion and an analog portion. The digital portion encodes binary data for the following analog portion and also performs signal processing functions such as data scrambling, dynamic error matching, spur reduction coding, filtering, etc. The analog portion of the segmented DAC consists of precision matched analog circuits that convert the encoded data to analog currents or voltages.

Typical analog circuit non-idealities result in mismatches between unit slice output current pulses of: magnitude errors, timing offsets, and pulse width errors. These mismatches between the unit slices fundamentally limit the dynamic range (effective number of bits, SNR, etc.) of the DAC.

Against this background, the problem addressed by the present invention is to provide a conversion circuit, which overcomes the above mentioned problems.

SUMMARY

The present invention solves this object by a digital to analog conversion, DAC, device with the features of claim 1, and a calibration method with the features of claim 18.

Accordingly it is provided:

A digital to analog conversion, DAC, device for converting digital signals to analog signals, the DAC device comprising a RF output for outputting the analog signals, a thermometer segment comprising a first number, i.e. at least one, of data slices and a second number, i.e. at least one, of calibration slices, and a calibration controller, which electrically disconnects one of the data slices from the RF output and at the same time connects one of the calibration slices to the RF output as replacement slice for the respective data slice and performs a calibration of the disconnected data slice.

A calibration method for a digital to analog conversion, DAC, device comprising a thermometer segment comprising a first number of data slices switchably connected to an RF output and a second number of calibration slices switchably connected to the RF output, the method comprising controllably electrically disconnecting one of the data slices from the RF output, controllably electrically disconnecting one of the calibration slices to the RF output as replacement slice for the respective data slice, and calibrating the disconnected slice, i.e. with a calibration controller The DAC device comprises a first number of data slices, wherein the first number depends on the total bit depth of the digital input values to the DAC device. The number of data slices can e.g. equal $M=2^{Bit\ Depth}-1$.

The term "slice" in this context refers to a circuit arrangement, which produces an output current or voltage that represents a corresponding step in the output of the DAC device. Just as an example, a 3 bit DAC device (digital input values 000-111, decimal values 0-15) would comprise fifteen slices. Every slice would represent the same amount in the final output value and for producing a respective output value the respective number of slices would be activated. For example a digital value of 5 would be converted into an output value with $5/15^{th}$ of the total output amplitude and five slices would be active.

The first number of data slices would therefore be enough to convert the required digital bits into a single analog value. However, the DAC device of the present invention adds a second number of extra calibration slices in the thermometer segment of the DAC device beyond the minimum required number of slices M.

In addition, the DAC device further comprises a calibration controller to perform a background calibration of the DAC device. The term "background calibration" refers to a calibration that is performed during runtime of the DAC device, i.e. in the background of the normal operation. To perform such a background calibration the calibration controller can individually disconnect single data slices from the RF output of the DAC device. At the same time the calibration controller will substitute the disconnected data slice by one of the calibration slices. It is understood, that the data slices and the calibration slices can comprise the exact same internal arrangement or composition. The differentiation of the two types of slices can be based merely on the fact, that the calibration slices are additional slices compared to the minimum required number of slices in the respective DAC device.

Since the differentiation is only verbose and not technical, it is understood, that any data slice can be used as calibration slice and vice versa.

In analog to digital converters, sampling rates less than multi-GHz may result in the dominant analog impairments being found in the reference current used in each analog unit slice. Dynamic Element Matching (DEM) can be employed to rapidly scramble the address order of the MSB data being mapped to the identical analog unit slices with some success in improving dynamic performance. DEM does not actually reduce the errors, but shuffles the errors around so that on average, they have less detrimental impact. Foreground calibration and factory measurement of analog imperfections and static mapping these imperfections to the minimal impacted unit slices can also been proposed to improve dynamic performance beyond DEM For multi-GHz DACs, the most detrimental analog impairments have been found by the inventors as typically related to timing mismatch and dynamic output pulse shapes.

The direct background calibration of the present invention allows canceling errors out by calibrating single data slices during operation for even greater improvement in dynamic range of the DAC device.

It is the capability of the present invention to actually eliminate or reduce the errors of the single data slices that enables dynamic range performance that exceeds other approaches.

It shall be understood that DEM and static mapping can be used in addition to background calibration of the present invention to further reduce second order residual errors that exist after background calibration.

Further embodiments of the present invention are subject of the further subclaims and of the following description, referring to the drawings.

In a possible embodiment, each one of the data slices and each one of the calibration slices can comprise a connection changeover switch, which can also be called demultiplexer, which controllably connects an output of the respective slice either to the RF output or an input of the calibration controller. The connection changeover switch enables the respective slice under calibration to be taken "offline" or electrically disconnected from the output summing circuit and instead enables the output of the respective slice to be routed to the calibration controller. The connection changeover switch can in one embodiment be provided as an analog switch or demultiplexer.

In a possible embodiment, the connection changeover switch can comprise a common mode control input. If the connection changeover switch is designed, such that its control signal is a common mode input, then the common-mode rejection ratio within the connection changeover switch reduces a response of the connection changeover switch to the switching state change by an order of magnitude.

In a possible embodiment, each one of the data slices and each one of the calibration slices can comprise a data changeover switch or multiplexer, which controllably selects one of a plurality of different input signals for the respective slice. The data changeover switch allows disconnecting the respective slice on the input side from the operational signal chain and providing the slice e.g. with calibration signals or patterns or null signals or patterns.

The calibration controller can e.g. control the data changeover switch of the respective slice to first provide the slice with a null pattern, to take it offline in a controlled manner. After the slice is taken offline, it can be provided with a calibration pattern, which allows the calibration controller to calibrate the respective slice. Various calibration patterns can be used to improve analog impairments, like e.g. pulse magnitude, timing offset, duty cycle, etc. The specific calibration patterns can be provided depending on the specific circuitry in the slices.

When the calibration is finished, the respective slice can be put online again by applying a null pattern for a specific amount of time, e.g. until the output at the connection changeover switch settles. Then the respective slice can be provided via the data changeover switch with input data of the DAC device and connected by the connection changeover switch to the RF output.

In a possible embodiment, the DAC device can comprise a low rate clock generator, which provides a low rate clock signal, wherein the data changeover switch is supplied with the low rate clock signal, which has a clock rate that is lower than a clock rate of a full rate clock signal that is provided to the connection changeover switch, especially an integer fraction of the clock rate of the full rate clock signal.

Additional circuit functions in the DAC device that require a full rate clock add complications to the clock drive requirements and clock synchronization requirements which are already difficult at multi-GHz rates. Synchronous online, offline capability of the single slices can in one embodiment be achieved by simply adding a full-rate MUX and DEMUX circuit to each analog slice. However, in view of the mentioned effects the calibration controller can be provided with the low rate clock circuitry to minimize the increase of full rate clocked circuit components.

Using the data changeover switch with a low rate clock signal allows for the additional circuitry required for background calibration to be low speed and asynchronous of the full rate DAC clock.

In a possible embodiment, the data changeover switch can be provided with a calibration pattern and/or a null pattern and/or a thermometer encoded signal as input signals. This allows the data changeover switch to select in every moment the necessary signal.

In a possible embodiment, the data changeover switch can be connected to a serializer of the respective slice and provides the selected input signal to the serializer. The data changeover switch may provide the data to the serializer in parallel data packets at the clock rate of the low rate clock signal. To convert this parallel data to serial data at the required DAC sample rate, the serializer is used, which converts the parallel data from the data changeover switch to a single bit stream of full clock rate data.

In a possible embodiment, each one of the data slices and each one of the calibration slices can comprise a switching element, e.g. an analog switch like e.g. a transistor based analog switch, wherein the output of the serializer is the input to the switching element, and the output of the switching element is the input to the connection changeover switch. The switching element is used for finally re-timing the data onto the pristine DAC device output clock, i.e. the full clock rate signal.

In a possible embodiment, the DAC device can comprise a full rate clock generator, which provides a full rate clock signal to the switching elements of the data slices and the calibration slices, and which provides a full rate serializer clock signal to the serializers of the data slices and the calibration slices. The full rate clock signal and the full rate serializer clock signal can e.g. comprise the same clock rate but be displaced to each other, i.e. comprise a phase offset. The full rate clock signal and the full rate serializer clock signal both can have a higher clock rate than the low rate clock signal. The full rate clock signal and the full rate serializer clock signal serve, as already explained above, to transform the parallel data from the data changeover switch to synchronized serial data at the data rate of the full rate clock signal.

By implementing the background calibration with the data changeover switch, i.e. within the digital encoder, at the low rate clock rate, instead of at the full rate clock domain, the power penalty is minimal and implementation is straightforward.

In a possible embodiment, each one of the data slices and each one of the calibration slices can comprise a re-timing unit, which is coupled to the connection changeover switch and timely synchronizes a control signal for the connection changeover switch to the full rate serializer clock signal.

When the control signal to the connection changeover switch is generated by the calibration controller, it is re-timed onto the full rate serializer clock signal by the re-timing unit. By synchronizing the control signal with the full rate serializer clock signal, a slice transitioning from online to offline can e.g. occur simultaneously with another slice that is transitioning from offline to online. If both slices are fed the same null data pattern during the transition, the partial pulse responses from the two slices are matched to within an order of magnitude.

In a possible embodiment, the re-timing unit can comprise a latch, which is supplied with the full rate serializer clock signal, and a filter, especially an analog filter, which filters the edge rate of the output signal of the latch, wherein the filtered signal is provided to the connection changeover switch as the control signal.

The latch ensures the correct timing of the signal. The edge rate is controlled by the filter before reaching the connection changeover switch. The analog filter therefore ensures that high speed glitch energy from the digital section is isolated from the analog output.

In a possible embodiment, the calibration controller can comprise a measurement circuit, which measures the output signal of the respective data slice or calibration slice, which is connected to the calibration controller, i.e. the input of the measurement circuit, and provides a respective measurement result. The measurement circuit is adapted to the output of the slices and e.g. measures an output current or voltage.

In a possible embodiment, the calibration controller can comprise an averaging circuit connected to the measurement circuit, wherein the averaging circuit averages the measurement result and/or the error in the measurement result.

In a possible embodiment, the calibration controller can comprise a control circuit, which is connected to the averaging circuit and calculates a correction signal and a control signal, e.g. based on the averaged measurement result and/or the averaged error in the measurement result.

The correction signal can e.g. be provided to the switching elements in the slices and represent appropriate trim voltages and currents for internal calibration circuitry of the switching elements. The control signal serves to control the data changeover switches in the single slices and controls the slices to provide the necessary data to the respective slice. In addition, the control signal serves to control the connection changeover switches in the slices and can e.g. be provided to the connection changeover switches via the re-timing unit.

During calibration of the single slices, there may be several different metrics of the slices to calibrate. Yet there is ample time to perform simple measurements for each of them as the slice, which is to be calibrated, is completely offline and substituted by another slice.

In a possible embodiment, the correction signal can be provided to a digital to analog converter, which provides a trim voltage to the switching elements of the respective data slices and calibration slices.

In a possible embodiment, the control signal can be provided to the connection changeover switch and the re-timing circuit in every one of the data slices and every one of the calibration slices to specifically controller every single slice.

During operation of the DAC, calibration is permanently performed, i.e. in the background. The sequence can e.g. be as follows: First, when a calibration of one slice is complete, the calibration controller controls the respective data changeover switch to provide the respective slice with null data, and controls the data changeover switch of another slice to provide null data, this slice can also be called null slice. This occurs synchronously at the full clock rate of the DAC device, because the serializer is used for each slice and the phase of the low rate clock signal relative to the full rate serializer clock signal is fixed for all slices.

Second, the newly selected null slice, is transitioned to being the calibration slice, as the control signal is applied to the connection changeover switch, i.e. the slice is disconnected from the RF output and connected to the calibration controller.

Third, once the analog transition has completed the slice is offline and calibration patterns can be applied via the data changeover switch. While the slice is offline, various calibration patterns to improve analog impairments can be applied, for example: pulse magnitude, timing offset, duty cycle, etc. When calibration for one slice completes, a new slice is selected for calibration and the process repeats.

In a possible embodiment, the DAC device can comprise a correction slice, which is coupled to the RF output and performs a DC offset correction on the RF output.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments which are specified in the schematic figures of the drawings, in which.

Figure 1:
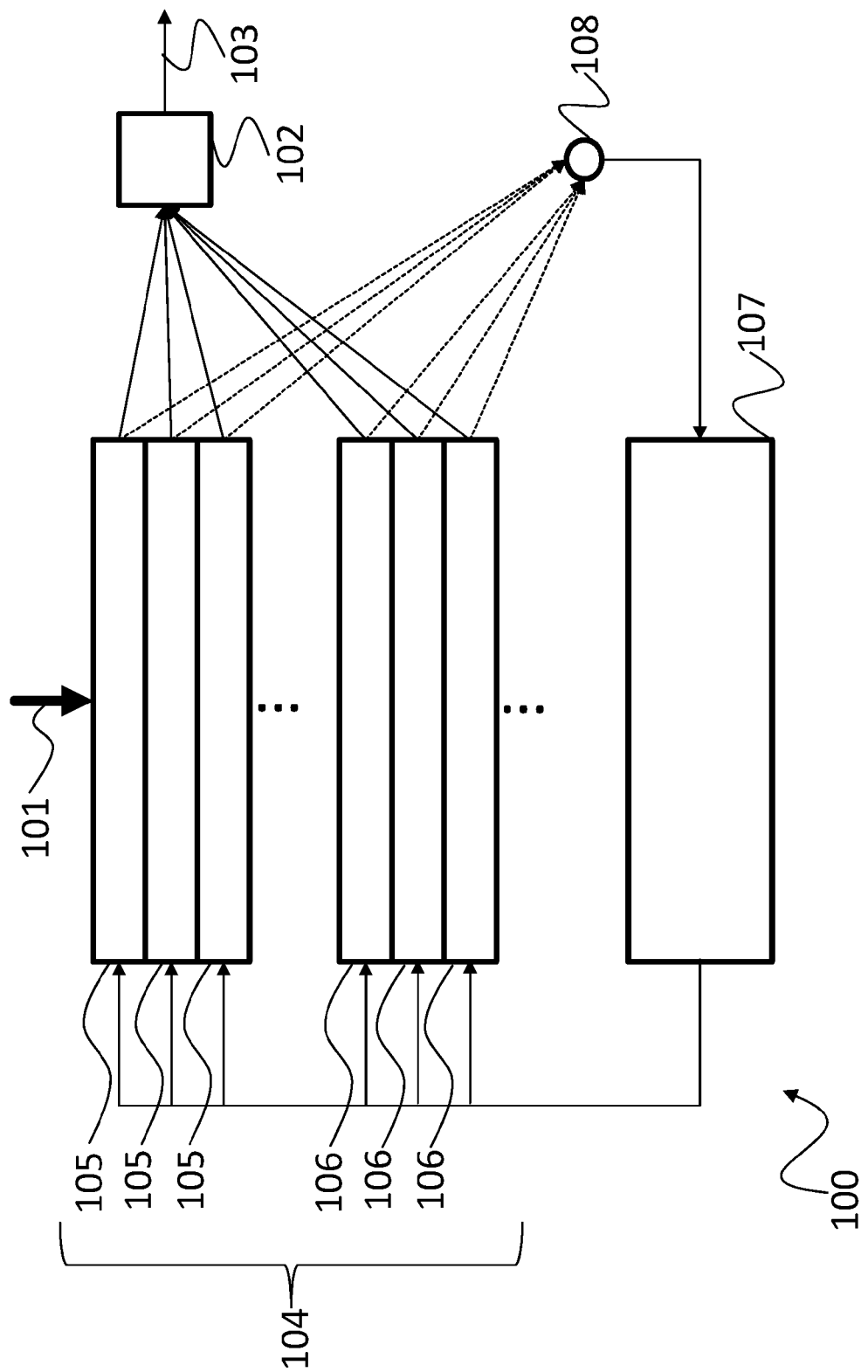
FIG. 1 shows a block diagram of an embodiment of a DAC device according to an embodiment of the present invention.

The appended drawings are intended to provide further under-standing of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated other-wise.

DETAILED DESCRIPTION OF THE DRAWINGS

FIG. 1 shows a block diagram of a possible DAC device 100. The DAC device 100 comprises receives a digital signal 101 and converts that signal into an analog signal 103, e.g. a current or voltage, at his RF output 102. The DAC device 100 comprises a thermometer segment 104 that converts the digital signal into a plurality of single voltages or currents that are added together in the RF output 102.

The thermometer segment 104 comprises a plurality of data slices 105 and a plurality of calibration slices 106. In FIG. 1 three data slices 105 and three calibration slices 106 are shown, wherein further data slices 105 and calibration slices 106 are hinted at by three dots. It is understood, that the differentiation of data slices 105 and calibration slices 106 is just a verbose differentiation and that the data slices 105 and calibration slices 106 can be structurally identical. The differentiation arises because the data slices 105 are provided in such a number as to cover the required bit depth of the DAC device 100. The calibration slices 106 are in contrast provided in addition to the necessary minimum number of data slices 105. Therefore, usually the number of data slices 105 will be higher than the number of calibration slices 106. E.g. only a single calibration slice 106 can be provided in addition to the data slices 105. In addition, it is understood that the number of data slices 105 and calibration slices 106 is just exemplary.

The DAC device 100 further comprises a calibration controller 107 with an input 108. The calibration controller 107 can e.g. comprise a programmable logic, like e.g. a controller, an ASIC, a DSP, a CPLD, a FPGA or the like. The calibration controller 107 can control the single data slices 105 and calibration slices 106 to either connect to the RF output 102 or the input 108. This allows the calibration controller 107 to take offline single data slices 105 and substitute them with a respective calibration slice 106.

While a single data slice 105 is in the offline state it is not connected to the RF output 102 but to the input 108. That means that the output of the respective data slice 105 does not influence the analog signal 103. This allows the calibration controller 107 to provide specific patterns, e.g. test patterns, to the data slice 105 in the offline state and verify or analyze the output of the data slice 105 to calculate the correction signal.

Figure 2:
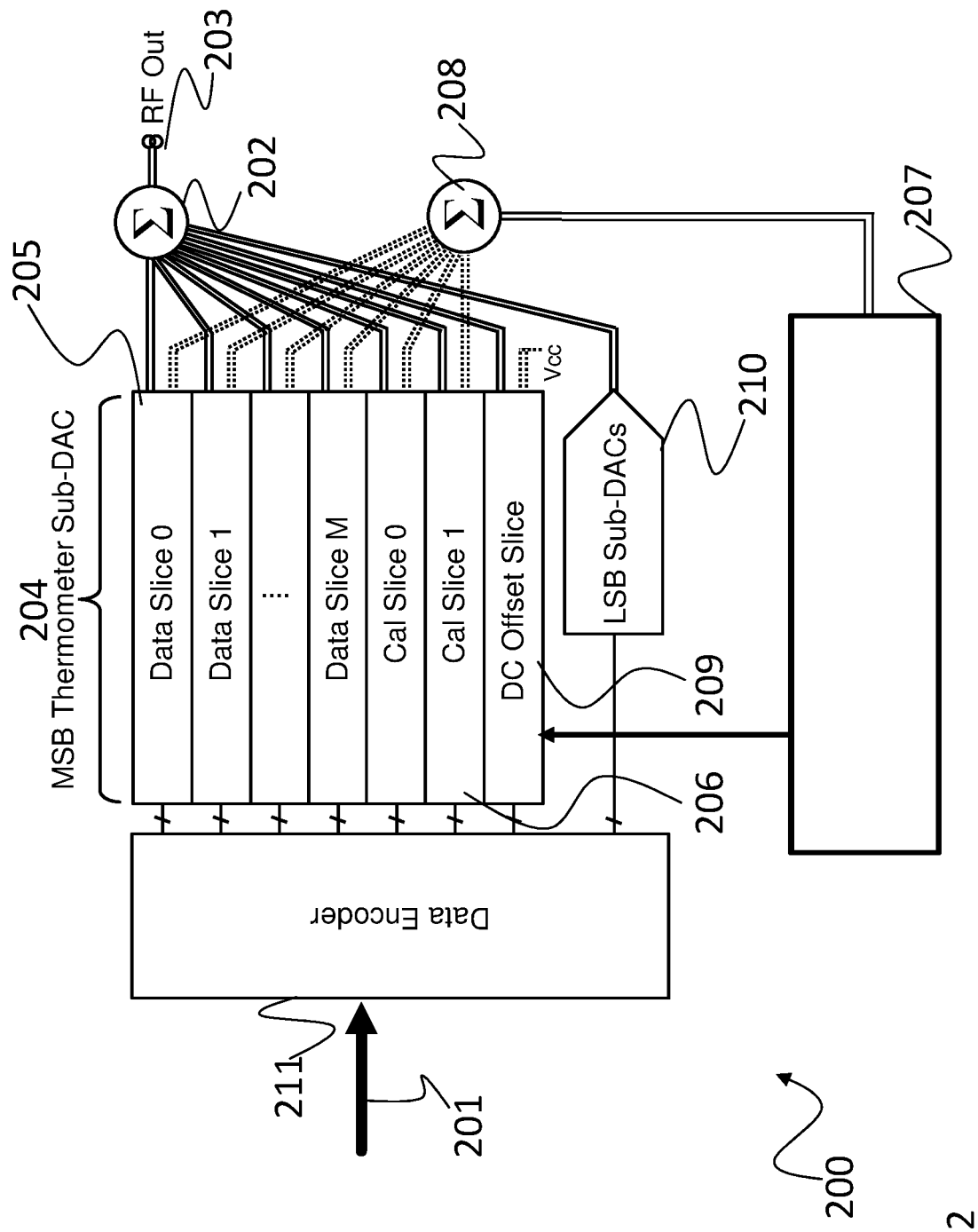
FIG. 2 shows a block diagram of another embodiment of a DAC device according to an embodiment of the present invention.

FIG. 2 shows a block diagram of another possible DAC device 200. The DAC device 200 comprises a data encoder 211, which encodes the digital signal 201, i.e. prepares the digital signal 201 for further processing in the data slices 205 and calibration slices 206. The data encoder 211 encodes the binary signal 201 to thermometer coded data and also performs signal processing functions such as data scrambling, dynamic error matching, spur reduction coding, filtering, etc.

The thermometer segment 204 in addition to the data slices 205 and calibration slices 206 comprises a correction slice 209, which performs a DC offset correction at the RF output 202 of the DAC device 200.

In the DAC device 200 the thermometer segment 204 performs conversion of the most significant bits of the digital signal 201. The DAC device 200 however also comprises at least one further DAC for the least significant bits of the digital signal 201. Such further DACs can e.g. be binary DACs or further thermometer DACs. It is understood, that this further DACs are optional.

In FIG. 2 all the connections between the slices 205, 206, 209 and the RF output 202 or the input 208 to the calibration controller 207 are provided as differential signals, i.e. via two signal lines. This optional implementation improves signal quality and increases the stability of the signals.

Figure 3:
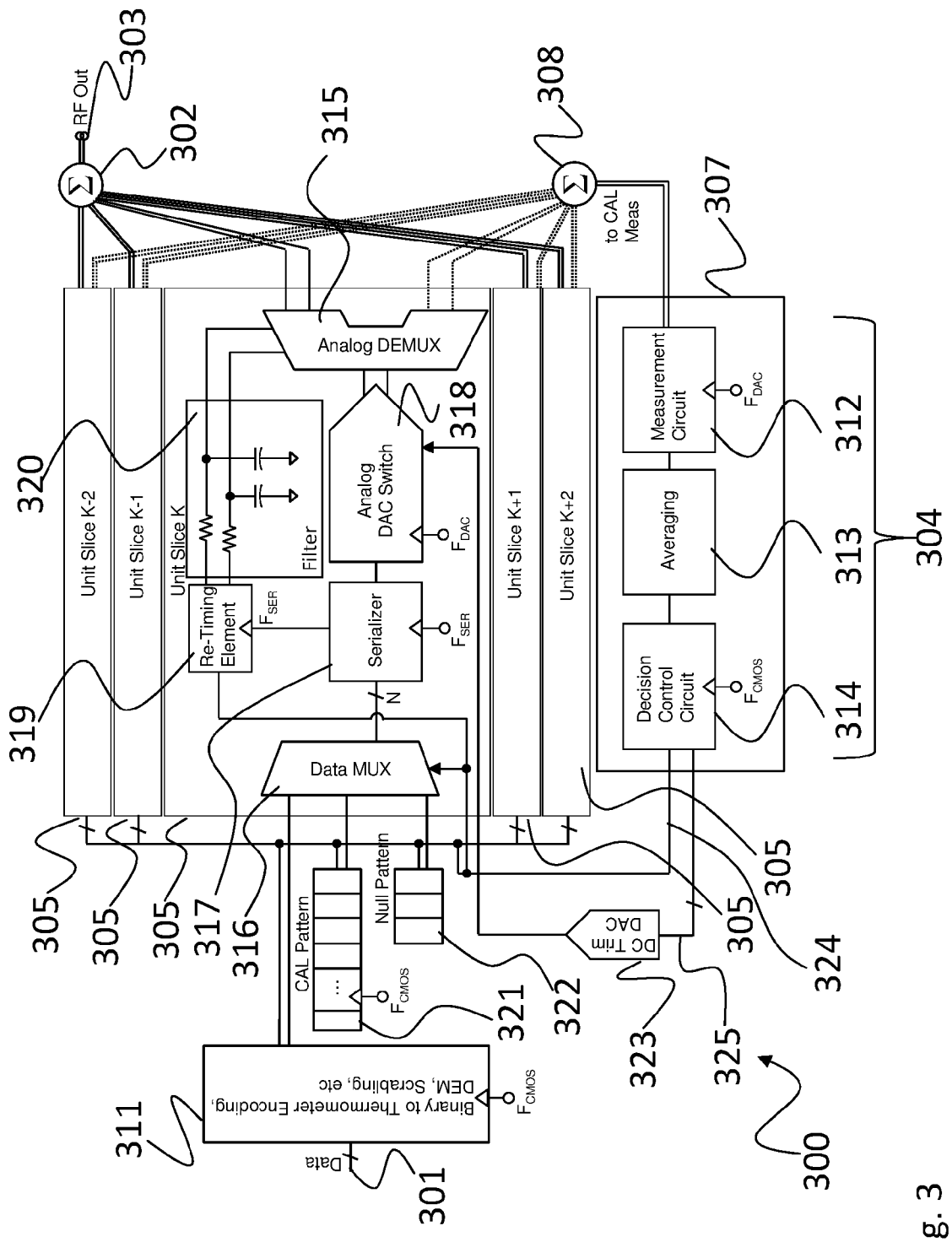
FIG. 3 shows a block diagram of another embodiment of a DAC device according to an embodiment of the present invention.

FIG. 3 shows a block diagram of another possible DAC device 300. Since the data slices and the calibration slices are technically identical in the following both types of slices will be called unit slices or simply slices 305. Just exemplarily and representing any one of the slices 305 one slice 305 is shown in detail.

The slice 305 on the input side comprises a data changeover switch 316, which can controllably select one of different input sources or signals and forwards the respective input signal to the further elements of the slice 305. The input signals can e.g. comprise the therurometer encoded digital signal 301, a calibration pattern or different calibration patterns 321, a null pattern 322 or the like.

During normal operation, i.e. when a slice 305 is not being calibrated, the data changeover switch 316 will usually receive the parallel digital data from the data encoder 311 and forward this data to serializer 317. The serializer 317 will then convert the parallel data from the data changeover switch 316 into a serial string of single bits and provide it to switching device 318.

In the DAC device 300 the switching device 318 is embodied as an analog DAC switch 318. This switching device 318 will change its switching state according to the serialized bit stream from serializer 317 and provide a respective output, i.e. a respective output current or voltage.

The output of the switching device 318 is then routed by the connection changeover switch 315 to the RF output 302, where the output of all slices 305 is summed up to generate the overall analog output signal 303.

In case that a slice is being calibrated, the control circuit 314 of the calibration controller 304 controls the respective data changeover switch 316 to first provide the serializer 317 with a null pattern 322 and then with the respective calibration pattern 321.

At the same time, i.e. when the data changeover switch 316 is switched from the null pattern 322 to the calibration pattern 321, the control circuit 314 controls connection changeover switch 315 to connect the output of the switching device 318 to the input 308 of the calibration controller 304.

Prior to reaching the connection changeover switch 315 however, the control signal 325 is re-timed by the re-timing circuit, here comprising a latch 319 and an analog filter 320, especially a high-pass filter 320.

In the slice 305 two time domains exist, a first time domain is driven by the low rate clock signal $F_{CMOS}$. The second time domain is driven by the full rate clock signal $F_{DAC}$ and the full rate serializer clock signal $F_{SER}$. The full rate clock signal $F_{DAC}$ and the full rate serializer clock signal $F_{SER}$ have the same clock rate but may be out of phase. The low rate clock signal $F_{CMOS}$ has a clock rate that is an integer fraction of the clock rate of the full rate clock signal $F_{DAC}$ and the full rate serializer clock signal $F_{SER}$.

The latch 319 is provided with the full rate serializer clock signal $F_{SER}$. By synchronizing the latch 319 with the full rate serializer clock signal $F_{SER}$ a slice 305 transitioning from online to offline occurs simultaneously with another slice 305 transitioning from offline to online. If both slices 305 are fed the same null data pattern during the transition, the partial pulse responses from the two slices 305 are matched to within an order of magnitude. The analog filter 320 ensures that high speed glitch energy from the digital section is isolated from the analog output of the connection changeover switch 315.

After a slice 305 is connected to the calibration controller 304, the slice 305 is provided with one or a series of calibration patterns 321. Since the slice 305 is then in an offline state, the duration of the calibration is irrelevant and does not influence the analog output 303.

In the calibration controller 304 a measurement circuit 312 will measure the output, i.e. a current or voltage, of the respective slice 305 and provide the measurement result to the averaging circuit 313 that will average the result or an error in the result and provide the result to the control circuit 314. The control circuit 314 will then calculate based on the averaged values a correction signal 324. This correction signal 324 is then converted via digital to analog converter 323 into analog trim voltages or currents and provided to the switching device 318 for internal calibration.

After the calibration is finished, the slice 305 is then provided with the null pattern 322 again until the output of the switching device 328 or the connection changeover switch 315 settles. Then the slice 305 can be integrated into the signal generation via RF output 302 and another slice 305 can be taken offline for calibration.

Figure 4:
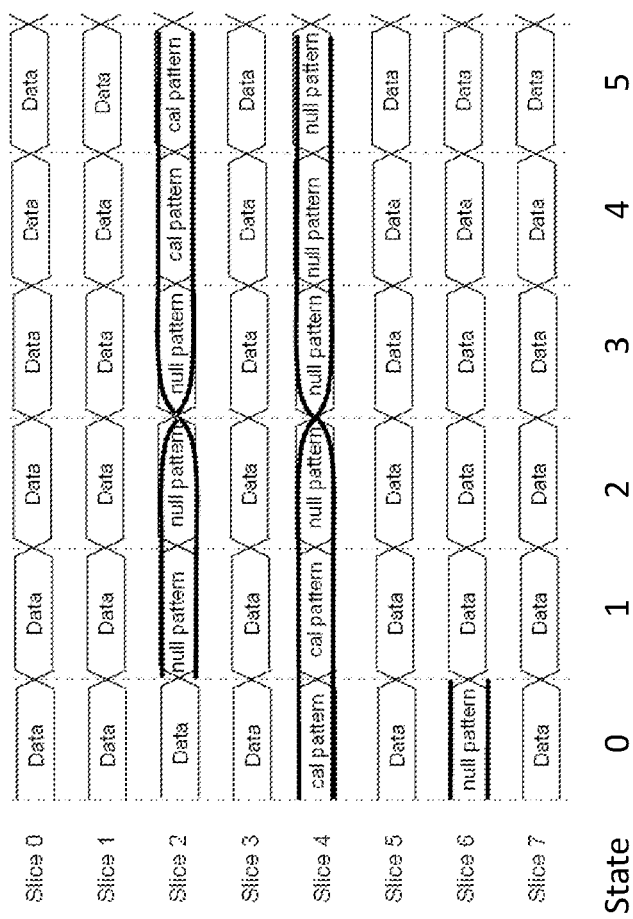
FIG. 4 shows a signal sequence in an embodiment of a DAC device according to an embodiment of the present invention.

FIG. 4 shows a signal sequence for a calibration process of one slice in an embodiment of a DAC device 100, 200, 300.

The order of events for stepping through calibration is as follows:

First, when a calibration of one slice, here slice 6, is complete, the calibration controller controls the respective data changeover switch to provide the respective slice with null data, e.g. slice 6 in state 0. The calibration controller then controls the data changeover switch of another slice, here slice 2, to provide null data, this slice can also be called null slice, e.g. slice 2 in states 2 and 3. This occurs synchronously at the full clock rate of the DAC device, because the serializer is used for each slice and the phase of the low rate clock signal relative to the full rate serializer clock signal is fixed for all slices.

Second, the newly selected null slice, slice 2, is transitioned to being the calibration slice, as the control signal is applied to the connection changeover switch, i.e. the slice is disconnected from the RF output and connected to the calibration controller, here between states 2 and 3.

Third, once the analog transition has completed the slice is offline and calibration patterns can be applied via the data changeover switch, slice 2 in states 4 and 5. While the slice is offline, various calibration patterns to improve analog impairments can be applied, for example: pulse magnitude, timing offset, duty cycle, etc. When calibration for one slice completes, a new slice is selected for calibration and the process repeats.

In FIG. 4 the change between slices 6 and 2 for calibration has been explained. It can be seen, that slice 4 is also in calibration mode. The change from slice 4 to another slice lies beyond the limits of the diagram and will be performed analogous to the change from slice 6 to slice 2.

This means that a plurality of slices can be calibrated in parallel if the respective number of additional slices is provided in the DAC device.

Figure 5:
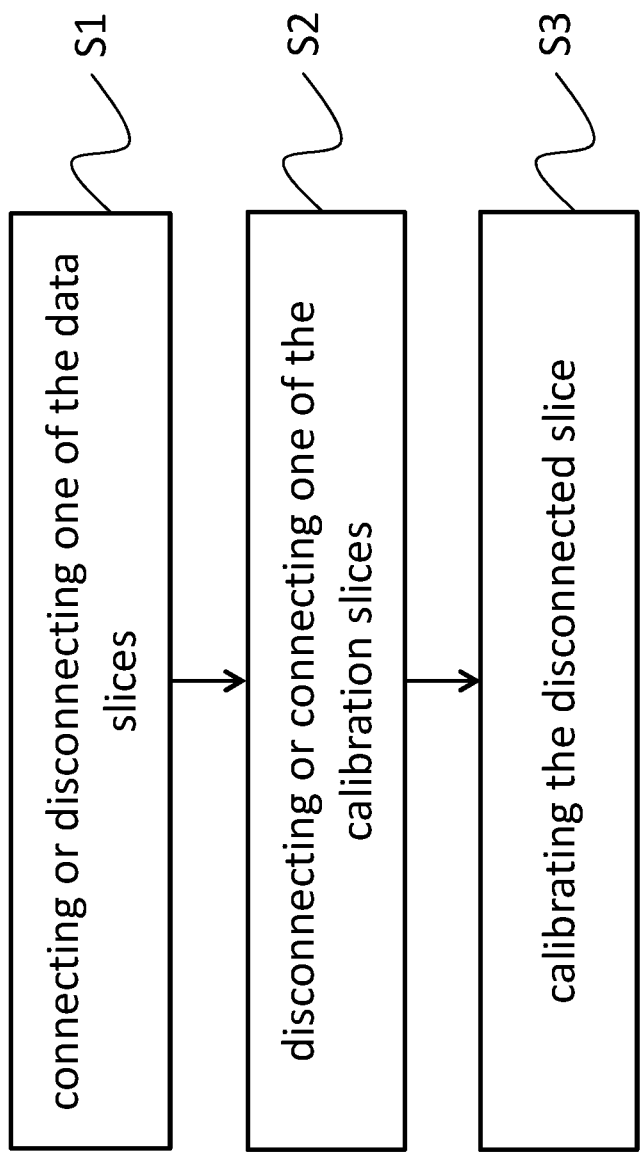
FIG. 5 shows a flow diagram of an embodiment of a method according to an embodiment of the present invention.

FIG. 5 shows a flow diagram of an embodiment of a calibration method for a digital to analog conversion, DAC, device 100, 200, 300 comprising a thermometer segment 104, 204, 304 comprising a first number of data slices 105, 205, 305 switchably or controllably connected to an RF output 102, 202, 302 and a second number of calibration slices 106, 206, 306 switchably or controllably connected to the RF output 102, 202, 302.

The method comprises controllably electrically connecting or disconnecting S1 one of the data slices 105, 205, 305 from the RF output 102, 202, 302, and controllably electrically disconnecting or connecting S2 one of the calibration slices 106, 206, 306 to the RF output 102, 202, 302 as replacement slice for the respective data slice 105, 205, 305. It is understood, that if one data slice 105, 205, 305 is disconnected from the RF output 102, 202, 302, a calibration slice 106, 206, 306 is connected to the output and vice versa. It is further understood, that since technically the data slice 105, 205, 305 and the calibration slices 106, 206, 306 may be identical, any data slice 105, 205, 305 can be a calibration slice 106, 206, 306 in the next calibration cycle. The method further comprises calibrating S3 the disconnected slice with a calibration controller 107, 207, 307.

Controllably electrically connecting or disconnecting S1, S2 comprises connecting an output of the respective slice 106, 206, 306, 105, 205, 305 either to the RF output 102, 202, 302 or an input 108, 208, 308 of the calibration controller 107, 207, 307. Further, controllably electrically disconnecting or connecting S1, S2 comprises selecting one of a plurality of different input signals 301, 312, 322 for the respective slice 106, 206, 306, 105, 205, 305, especially at a low clock rate of a low rate clock signal $F_{CMOS}$, wherein the input signals 312, 322 especially comprise a calibration pattern and/or a null pattern and/or a thermometer encoded signal as input signals 301, 312, 322.

The selected input signals 301, 312, 322 can then be serialized in the respective slice 106, 206, 306, 105, 205, 305, especially at a full clock rate of a full rate serializer clock signal $F_{SER}$. A switching device like an analog switch that produces the required analog output signal in the respective slice 106, 206, 306, 105, 205, 305 can then be switched based on the serialized input signals 312, 322, especially at a full clock rate of a full rate clock signal $F_{DAC}$.

To reduce glitches in the output signal, the connecting or disconnecting S1, S2 can be timely synchronized to the full rate serializer clock signal $F_{SER}$, especially with a latch 319 and a filter 320.

For calibrating the single slices 106, 206, 306, 105, 205, 305, the output signal of the respective data slice 105, 205, 305 or calibration slice 106, 206, 306, which is to be calibrated, can be measured and a respective measurement result or error in the measurement result can be provided and e.g. be averaged.

Based on the measurement result and/or the averaged measurement result and/or the averaged error a correction signal 324 and a control signal 325 can be calculated. The correction signal 324 can be converted into a trim voltage or current for the switching elements 318 of the respective data slices 105, 205, 305 and calibration slices 106, 206, 306. The control signal 325 in contrast can be used for performing the connecting and disconnecting in every one of the data slices 105, 205, 305 and each calibration slices 106, 206, 306.

Finally, a DC offset correction can be performed on the RF output 102, 202, 302.

It is understood, that the single elements of the above described embodiments can be provided as a hardware, e.g. a controller, a software, especially comprising computer readable instructions, a programmable logic device, like e.g. a CPLD or FPGA, or the like.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

LIST OF REFERENCE SIGNS 100, 200, 300 DAC device
101, 201 digital signal
102, 202, 302 RF output
103, 203, 303 analog signal
104, 204, 304 thermometer segment
105, 205, 305 data slices
106, 206, 306 calibration slices
107, 207, 307 calibration controller
108, 208, 308 input
209 correction slice
210 LSB DAC segment
211, 311 data encoder
312 measurement circuit
313 averaging circuit
314 control circuit
315 connection changeover switch
316 data changeover switch
317 serializer
318 switching element
319 latch
320 filter
321 calibration pattern
322 null pattern
323 digital to analog converter
324 correction signal
325 control signal
$F_{CMOS}$ low rate clock signal
$F_{DAC}$ full rate clock signal
$F_{SER}$ full rate serializer clock signal
S1, S2, S3 method steps

The invention claimed is:

1. A digital to analog conversion, DAC, device for converting digital signals to analog signals, the DAC device comprising:

a radio frequency, RF, output for outputting the analog signals,
a thermometer segment comprising a first number of data slices and a second number calibration slices, and
a calibration controller, which electrically disconnects one of the data slices from the RF output and at the same time connects one of the calibration slices to the RF output as replacement slice for the respective data slice and performs a calibration of the disconnected data slice,
wherein each one of the data slices and each one of the calibration slices comprises a connection changeover switch, which controllably connects an output of the respective slice either to the RF output or an input of the calibration controller.

2. The DAC device of claim 1, wherein the connection changeover switch comprises a common mode control input.

3. The DAC device of claim 1, wherein each one of the data slices and each one of the calibration slices comprises a data changeover switch, which controllably selects one of a plurality of different input signals for the respective slice.

4. The DAC device of claim 3, comprising a low rate clock generator, which provides a low rate clock signal, wherein the data changeover switch is supplied with the low rate clock signal.

5. The DAC device of claim 3, wherein the data changeover switch is provided with a calibration pattern and/or a null pattern and/or a thermometer encoded signal as input signals.

6. The DAC device of claim 3, wherein the data changeover switch is connected to a serializer of the respective slice and provides the selected input signal to the serializer.

7. The DAC device of claim 6, wherein each one of the data slices and each one of the calibration slices comprises a switching element, wherein the output of the serializer is the input to the switching element, and the output of the switching element is the input to the connection changeover switch.

8. The DAC device of claim 7, comprising a full rate clock generator, which provides a full rate clock signal to the switching elements of the data slices and the calibration slices, and which provides a full rate serializer clock signal to the serializers of the data slices and the calibration slices.

9. The DAC device of claim 8, wherein each one of the data slices and each one of the calibration slices comprises a re-timing unit, which is coupled to the connection changeover switch and timely synchronizes a control signal for the connection changeover switch to the full rate serializer clock signal.

10. The DAC device of claim 9, wherein the re-timing unit comprises a latch, which is supplied with the full rate serializer clock signal, and a filter, especially an analog filter, which filters the edge rate of the output signal of the latch, wherein the filtered signal is provided to the connection changeover switch as the control signal.

11. The DAC device of claim 7, wherein the correction signal is provided to a digital to analog converter, which provides a trim voltage to the switching elements of the respective data slices and calibration slices.

12. The DAC device of claim 1, wherein the calibration controller comprises a measurement circuit, which measures the output signal of the respective data slice or calibration slice, which is connected to the calibration controller and provides a respective measurement result.

13. The DAC device of claim 12, wherein the calibration controller comprises an averaging circuit connected to the measurement circuit, wherein the averaging circuit averages the measurement result and/or the error in the measurement result.

14. The DAC device of claim 13, wherein the calibration controller comprises control circuit, which is connected to the averaging circuit and calculates a correction signal and a control signal based on the averaged measurement result and/or the averaged error in the measurement result.

15. The DAC device of claim 1, wherein the control signal is provided to the connection changeover switch and the re-timing circuit in every one of the data slices and every one of the calibration slices.

16. The DAC device of claim 1, comprising a correction slice, which is coupled to the RF output and performs a DC offset correction on the RF output.

17. A calibration method for a digital to analog conversion, DAC, device comprising a thermometer segment comprising a first number of data slices switchably connected to a radio frequency, RF, output and a second number of calibration slices switchably connected to the RF output, the method comprising:
controllably electrically disconnecting one of the data slices from the RF output,
controllably electrically connecting one of the calibration slices to the RF output as replacement slice for the respective data slice, and
calibrating the disconnected data slice with a calibration controller,
wherein controllably electrically connecting or disconnecting comprises controlling a connection changeover switch to connect an output of the respective slice either to the RF output or an input of the calibration controller, in the respective data slices or calibration slice.

18. The calibration method of claim 17,
wherein controllably electrically connecting or disconnecting comprises controlling a data changeover switch in the respective slice to select one of a plurality of different input signals for the respective slice, especially at a low clock rate of a low rate clock signal, wherein the input signals especially comprise a calibration pattern and/or a null pattern and/or a thermometer encoded signal as input signals.

19. The calibration method of claim 18, further comprising serializing the selected input signals, especially at a full clock rate of a full rate serializer clock signal, and
switching a switching device in the respective slice based on the serialized input signals, especially at a full clock rate of a full rate clock signal.

20. The calibration method of claim 19, comprising timely synchronizing the connecting or disconnecting to the full rate serializer clock signal, especially with a latch and a filter.

21. The calibration method of claim 17, comprising measuring the output signal of the respective data slice or calibration slice, which is to be calibrated and providing a respective measurement result, and especially averaging the measurement result and/or the error in the measurement result.

22. The calibration method of claim 21, comprising calculating a correction signal and a control signal based on the averaged measurement result and/or the averaged error in the measurement result, and converting the correction signal into a trim voltage or current to the switching elements of the respective data slices and calibration slices; and/or
using the control signal for performing the connecting and disconnecting in every one of the data slices and each calibration slices.

23. The calibration method of claim 17, comprising performing a DC offset correction on the RF output.

* * * * *